United States Patent [19]
Genova et al.

[11] Patent Number: 6,031,412
[45] Date of Patent: Feb. 29, 2000

[54] CONTROL OF THE BODY VOLTAGE OF A HV LDMOS

[75] Inventors: Angelo Genova, Delia; Mario Tarantola, Bareggio; Giuseppe Cantone, Siracusa; Roberto Gariboldi, Lacchiarella, all of Italy

[73] Assignee: STMicroelectronics S.r.l., Agrate Brianza, Italy

[21] Appl. No.: 09/096,401

[22] Filed: Jun. 11, 1998

[30] Foreign Application Priority Data

Jun. 24, 1997  [EP]  European Pat. Off. .............. 97830297

[51] Int. Cl.⁷ ..................................................... G05F 1/10
[52] U.S. Cl. ............................................ 327/537; 327/534
[58] Field of Search .................... 327/108, 111, 327/112, 534, 537, 538

[56] References Cited

U.S. PATENT DOCUMENTS

| | | |
|---|---|---|
| 5,081,371 | 1/1992 | Wong . |
| 5,321,313 | 6/1994 | Oberhauser ........................... 327/432 |
| 5,463,347 | 10/1995 | Jones et al. ............................ 330/253 |
| 5,502,632 | 3/1996 | Warmerdam et al. . |
| 5,506,539 | 4/1996 | Kelly et al. ............................ 327/379 |
| 5,631,588 | 5/1997 | Bertolini ................................ 327/108 |
| 5,650,737 | 7/1997 | Eilley .................................... 327/108 |

FOREIGN PATENT DOCUMENTS

| | | | |
|---|---|---|---|
| 0 357 528 A1 | 8/1989 | European Pat. Off. ....... H03K 17/08 |
| 0 743 752 A1 | 11/1996 | European Pat. Off. ...... H03K 17/687 |
| 94/27370 | 11/1994 | WIPO ............................. H03K 17/04 |

*Primary Examiner*—Toan Tran
*Assistant Examiner*—Anh-Quan Tra
*Attorney, Agent, or Firm*—Theodore E. Galanthay; Allen, Dyer, Doppelt, Milbrath & Gilchrist, P.A.

[57] ABSTRACT

A circuit for charging a capacitance using an LDMOS integrated transistor controlled in a manner to emulate a high voltage charging diode of the capacitance. The circuit avoids the switch-on of parasitic bipolar transistors of the LDMOS structure during transient states. The circuit includes a number of junctions directly biased between a source node and a body node of the LDMOS transistor, a current generator referred to a ground of the circuit, at least one switch between the source and a first junction of a chain of directly biased junctions, and a limiting resistor connected between the body and the current generator referred to ground. The switch is open during a charging phase of the capacitance and is closed when the charging voltage of the capacitance exceeds a preestablished threshold responsive to a control signal. The switch is controlled by a logic signal active during the phase in which the supply voltage of the integrated circuit is lower than the minimum switch-on voltage of the same integrated circuit, for charging the body with a current whose maximum value is limited to a preestablished value.

12 Claims, 2 Drawing Sheets

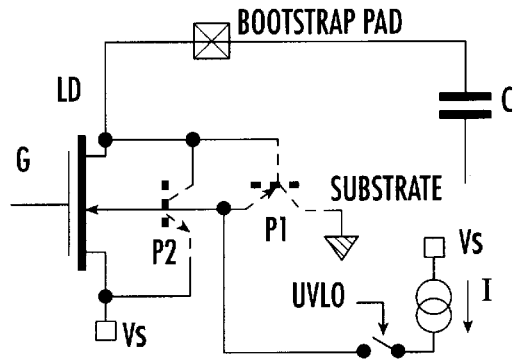
FIG. 2.
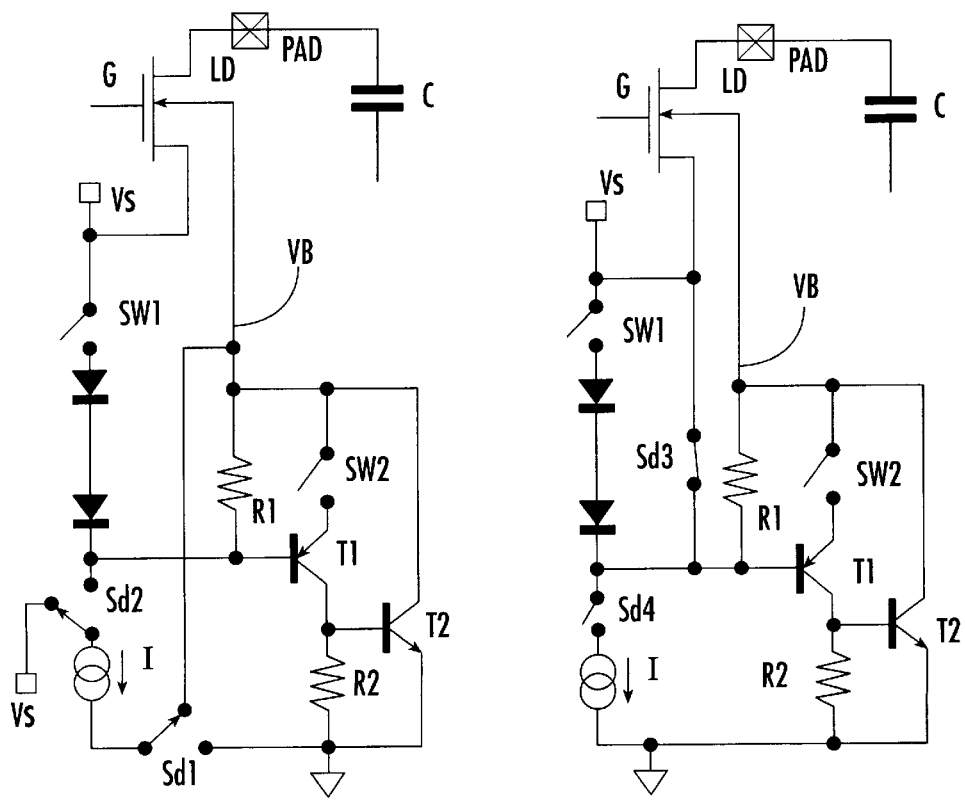
FIG. 3a.  FIG. 3b.

CONTROL OF THE BODY VOLTAGE OF A HV LDMOS

FIELD OF THE INVENTION

The present invention relates to integrated circuits, and, more particularly, to driving circuits for power stages. In particular the invention refers to a bootstrap or similar system wherein a capacitor is charged by means of an LDMOS integrated transistor emulating a high voltage diode.

BACKGROUND OF THE INVENTION

In integrated circuits that comprise output stages for driving discrete power devices or themselves integrated on the same chip containing the control circuitry, it is common to use a bootstrap capacitor to ensure correct powering of the driving stage. In these systems, it is essential that the bootstrap capacitor be charged in very short periods of time and this is usually attained using a diode emulator LDMOS transistor to rapidly charge the bootstrap capacitor.

In the case of a driving circuit for a so-called High Side Driver (HSD) of a half-bridge output stage, the LDMOS transistor should be capable of charging the bootstrap capacitance when the HSD is referred to low voltage (that is, when its output is low). The LDMOS transistor should emulate a high impedance when the HSD is referred to high voltage (that is, when its output is high). These functioning conditions must also be ensured during the HSD switching phase from high to low voltage or vice versa. This should be so despite possible current injections deriving from charging and discharging the capacitances associated with the LDMOS integrated structure that must sustain the high voltage supply of the power device.

The publication WO 94/27370 discloses a half-bridge circuit comprising a driving module of the lower device, and a floating driving module of the higher power device. The driving module of the high side transistor is realized in an isolated well region, and a properly controlled LDMOS transistor emulates a high voltage charging diode of a bootstrap capacitor.

In these cases it is necessary to control the effects of the parasitic bipolar junction transistors associated with an LDMOS integrated structure. The document EP-A-0743752, points out and describes certain conditions that originate problems related to the switch-on of parasitic transistors of the LDMOS integrated structure. The reference also describes different circuit layouts capable of averting current consumption caused by the switch-on of the parasitic transistors of the LDMOS integrated structure, and which avoid the occurrence of conditions that may cause the destruction of the integrated device itself.

The above cited European patent application EP-A-0743752, is herein incorporated by way of direct reference. FIG. 1 highlights the protecting circuit device described in the European patent application. According to the approach described in the European patent application, there exists a functioning phase of the integrated circuit, referred to as UVLO, when the voltage supply Vs is less than the minimum switch-on voltage of the entire integrated device including also the LDMOS transistor. During this time, with SW1 and SW2 both open, the potential of the body node VB of the LDMOS structure is kept at the circuit ground potential.

On the other hand, these so-called multipurpose integrated devices may be useful in many applications, during a UVLO phase, for charging the bootstrap capacitance (C). In this case, if the LDMOS body structure is connected to ground, its efficiency in charging the bootstrap capacitance is considerably diminished. In fact, in this case the gate-drain voltage (Vgd) must be many Volts to keep the LDMOS integrated transistor in a conducting state, and to account for the notable body effect that would increase its threshold voltage (Vth).

In addition, by keeping the body of the LDMOS structure at ground during this function phase, when the threshold voltage of the UVLO control signal has a particularly high value (often greater than 10V in the case of fabrication processes referred to as BCD off-line) there exists the risk of a breakdown of the base-emitter junction of the parasitic bipolar transistor (P2 in the scheme of FIG. 2).

SUMMARY OF THE INVENTION

In view of the foregoing background, it is therefore an object of the present invention to provide means to prevent the above cited problems under any functioning condition of the integrated circuit.

This objective is fully achieved by the present invention through a circuit device capable of connecting, during a UVLO phase, the LDMOS body node potential at the voltage existing on the bootstrap capacitance plus a base-emitter voltage Vbe of a parasitic junction bipolar transistor of the same LDMOS integrated structure. In this manner, the body effect on the threshold voltage of the LDMOS transistor is effectively limited. This is done without notably aggravating the consumption of current across the parasitic transistors, thereby allowing for a more efficient charge of the capacitance.

The limit for the charging current of the body node may be assured, according to a first embodiment of the invention, by charging the same body node by means of the same current generator already used by the control circuit of the parasitic transistors according to the prior art European patent application No. 95830207.7.

Alternatively, a certain limit for the charging current of the body node may be assured through a resistance in series with the charging current path, which is switched, during the UVLO phase, on the supply node Vs.

BRIEF DESCRIPTION OF THE DRAWINGS

The various aspects, features and advantages of the present invention will become apparent upon perusal of the following detailed description when taken in conjunction with the attached drawings, wherein:

FIG. 2 schematically shows the parasitic bipolar transistors of the LDMOS structure and the general protecting principle of the present invention; and FIG. 3a and 3b show two alternative embodiments of the invention.

DETAILED DESCRIPTION OF THE PREFERRED EMBODIMENTS

Figure 1:
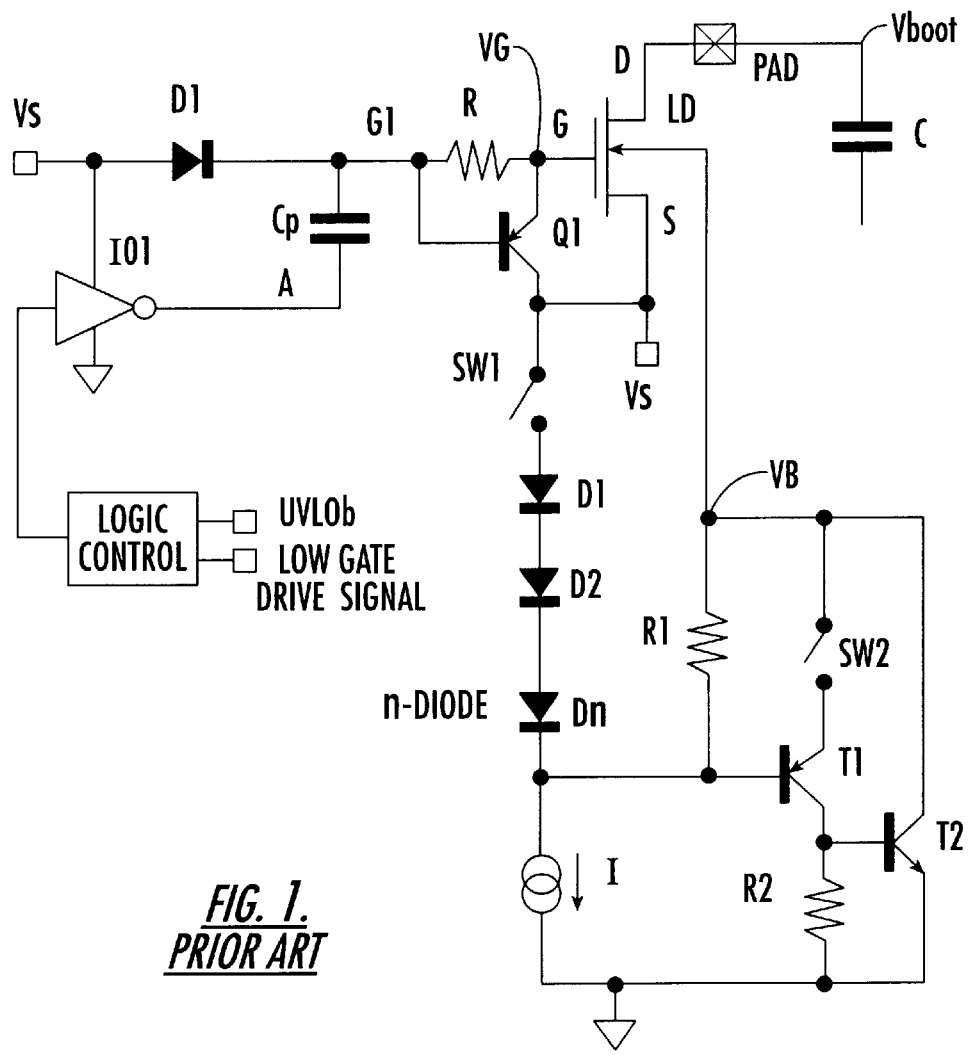
FIG. 1 shows, as previously cited, the control scheme of the LDMOS parasitic transistors, according to the prior art.

The general scheme of the device of the invention is illustrated in FIG. 2. Essentially, the device comprises at least one switch SWb which is closed by the UVLO signal during a functioning phase in which the voltage supply Vs of the circuit is lower than the switch-on threshold voltage of the LDMOS integrated transistor LD. The closing of the switch SWb determines the body node charge of the LDMOS integrated transistor LD whose potential is increased by a voltage Vbe if compared to the bootstrap voltage.

An essential aspect of the invention is that the charging of the body node VB is undertaken by limiting the maximum value of the charging current I so that the current that flows toward the substrate due to the switch-on of the LDMOS parasitic bipolar transistors P1 and P2 is limited.

FIG. 3a shows a first embodiment of the circuit device of the invention according to which, through the switches Sd1 and Sd2, both controlled by the UVLO signal (not indicated in figure), the current generator for the current I is connected respectively to the body node VB of the LDMOS transistor and to the supply node Vs. The current generator, already existing in the switch-on control circuit of the parasitic transistors, limits the maximum charging current of the body node Vb, without substantially incrementing the consumption of the LDMOS control system.

According to an alternative embodiment of the invention, shown in FIG. 3b, the charging of the body node VB takes place by commanding during an UVLO phase the two switches Sd3 and Sd4 as illustrated, connecting then through Sd3 and the limiting resistance R1, the body node VB to the supply node Vs. The switch Sd4 has the function of disconnecting, during this UVLO phase, the current generator for the current I of the LDMOS control circuit. This reduces the absorption of electrical power.

What is claimed is:

1. A circuit for charging a capacitance comprising:
   an LDMOS integrated transistor controlled in a manner to emulate a high voltage charging diode of the capacitance, the LDMOS integrated transistor comprising a source and a body, and defining at least one parasitic transistor; and
   a circuit to avert switch-on of the at least one parasitic transistor of the LDMOS integrated transistor during transient states, said circuit comprising
      a chain of n number of diode junctions directly biased between a source and a body of said LDMOS integrated transistor,
      at least one current generator referred to ground,
      a limiting resistor connected between the body and the at least one current generator,
      at least one switch between the source and a first junction of said chain, wherein said at least one switch is open during a charging phase of the capacitance and is closed when the charging voltage of the capacitance is greater than a preestablished threshold responsive to a control signal, and
      switching means, controlled by a logic signal active during a phase in which a supply voltage of the LDMOS integrated transistor circuit is lower than the minimum switch-on voltage of the same LDMOS integrated transistor circuit, for charging said body with a current having a maximum value limited to a preestablished value, and further comprising a transistor circuit connected to said limiting resistor providing a discharge path and prevent turn on of the at least one parasitic transistor.

2. A circuit according to claim 1, wherein said switching means comprises first means for charging the body with a current limited by the at least one current generator by operatively switching the at least one current generator between a supply voltage and the body.

3. A circuit according to claim 2, wherein said first means comprises first and second switches.

4. A circuit according to claim 1, wherein said switching means comprises second means for charging the body through said limiting resistor by operatively switching the limiting resistor to a supply voltage.

5. A circuit according to claim 4, wherein said switching means comprises third means for isolating the at least one current generator during the charging phase of the body.

6. A circuit for charging a capacitance comprising:
   an LDMOS integrated transistor controlled in a manner to emulate a high voltage charging diode of the capacitance, the LDMOS integrated transistor comprising a source and a body, and defining at least one parasitic transistor; and
   a circuit to avert switch-on of the at least one parasitic transistor of the LDMOS integrated transistor during transient states, said circuit comprising
      a chain of n number of diode junctions directly biased between a source and a body of said LDMOS integrated transistor,
      at least one current generator referred to ground,
      a limiting resistor connected between the body and the at least one current generator,
      at least one first switch between the source and a first junction of said chain, wherein said at least one first switch is open during a charging phase of the capacitance and is closed when the charging voltage of the capacitance is greater than a preestablished threshold responsive to a control signal, and
      at least one second switch, controlled by a logic signal active during a phase in which a supply voltage of the LDMOS integrated transistor circuit is lower than the minimum switch-on voltage of the same LDMOS integrated transistor circuit, for charging said body with a current having a maximum value limited to a preestablished value, and further comprising a transistor circuit connected to said limiting transistor to provide a discharge path and prevent turn on of the at least one parasitic transistor.

7. A circuit according to claim 6, wherein said at least one second switch comprises a pair of switches for charging the body with a current limited by the at least one current generator by operatively switching the at least one current generator between a supply voltage and the body.

8. A circuit according to claim 6, wherein said at least one second switch comprises a third switch for charging the body through said limiting resistor by operatively switching the limiting resistor to supply voltage.

9. A circuit according to claim 8, wherein said at least one second switch comprises a fourth switch for isolating the at least one current generator during the charging phase of the body.

10. A method for charging a capacitance using an LDMOS integrated transistor comprising a substrate and defining at least one parasitic transistor, and a circuit to avert switch-on of the at least one parasitic transistor of the LDMOS integrated transistor during transient states, the circuit further comprising at least one current generator, the method comprising the step of:
   limiting a maximum value of charging current that flows toward the substrate due to the switch-on of the at least one parasitic transistor;
   wherein said LDMOS integrated transistor comprises a source and a body: and further comprising the step of directly biasing a chain of n number of diode junctions between a source and a body of the LDMOS integrated transistor:
   connecting a limiting resistor between the body and the at least one current generator;

opening at least one first switch during a charging phase of the capacitance and closing the at least one first switch when the charging voltage of the capacitance is greater than a preestablished threshold responsive to a control signal; and controlling at least one second switch by a logic signal active during a phase in which the supply voltage of the integrated circuit is lower than the minimum switch-on voltage of the same integrated circuit, for charging the body with a current having a maximum value limited to a preestablished value.

11. A circuit according to claim 1, wherein said transistor circuit comprises first and second transistors and a resistor connected to the first and second transistors.

12. A circuit according to claim 6, wherein said transistor circuit comprises first and second transistors and a resistor connected to the first and second transistors.

* * * * *